(12) United States Patent
Lille (10) Patent No.: US 10,553,783 B2
(45) Date of Patent: *Feb. 4, 2020

(54) SPIN ORBIT TORQUE MAGNETORESISTIVE RANDOM ACCESS MEMORY CONTAINING SHIELDING ELEMENT AND METHOD OF MAKING THEREOF

(71) Applicant: SANDISK TECHNOLOGIES LLC, Addison, TX (US)

(72) Inventor: Jeffrey Lille, Sunnyvale, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/024,490

(22) Filed: Jun. 29, 2018

(65) Prior Publication Data

US 2020/0006633 A1 Jan. 2, 2020

(51) Int. Cl.

| G11C 11/00 | (2006.01) |
| H01L 43/02 | (2006.01) |
| H01L 27/22 | (2006.01) |
| G11C 11/16 | (2006.01) |
| H01L 43/12 | (2006.01) |
| H01L 43/10 | (2006.01) |

(52) U.S. Cl.
CPC ............ *H01L 43/02* (2013.01); *G11C 11/161* (2013.01); *G11C 11/1675* (2013.01); *H01L 27/226* (2013.01); *H01L 43/12* (2013.01); *G11C 11/1673* (2013.01); *H01L 43/10* (2013.01)

(58) Field of Classification Search
CPC .................................................. G11C 11/161

USPC ............................................................ 35/158
See application file for complete search history.

(56) References Cited

U.S. PATENT DOCUMENTS

| 5,831,174 | A | 11/1998 | Beaudoin |
| 7,684,226 | B2 | 3/2010 | Herner |
| 7,817,959 | B2 | 10/2010 | Harrison |
| 9,218,864 | B1 | 12/2015 | Yi et al. |
| 9,432,800 | B1 | 8/2016 | Yi et al. |
| 9,542,987 | B2 | 1/2017 | Naik et al. |

(Continued)

OTHER PUBLICATIONS

U.S. Appl. No. 15/701,761, filed Sep. 12, 2017, Sandisk Technologies LLC.

(Continued)

*Primary Examiner* — Hoai V Ho
(74) *Attorney, Agent, or Firm* — The Marbury Law Group PLLC (57) ABSTRACT

A Magnetoresistive Random Access Memory (MRAM) assembly includes a substrate, a plurality of MRAM cells, a plurality of bit lines, each bit line magnetically coupled to one of the plurality of MRAM cells, a plurality of word lines, each word line magnetically coupled to one of the plurality of MRAM cells, a first planar ferromagnetic shielding component located vertically above the substrate such that the plurality of bit lines and the plurality of word lines are located between the first planar ferromagnetic shielding component and the substrate, and a first insulating layer located between the first ferromagnetic shielding component and one of the bit lines or word lines such that the bit lines or word lines are not electrically connected to the first ferromagnetic shielding component.

16 Claims, 8 Drawing Sheets

(56) References Cited

U.S. PATENT DOCUMENTS

| | | | |
|---|---|---|---|
| 9,589,619 B2 | 3/2017 | Lee et al. | |
| 9,646,670 B2 | 5/2017 | Lee et al. | |
| 9,666,256 B1 | 5/2017 | Lai et al. | |
| 9,768,229 B2 | 9/2017 | Braganca et al. | |
| 9,818,465 B2 | 11/2017 | Bandiera | |
| 9,830,966 B2 | 11/2017 | Mihajlovic et al. | |
| 9,837,602 B2 | 12/2017 | Braganca | |
| 9,929,210 B2 | 3/2018 | Lai et al. | |
| 9,953,692 B1 | 4/2018 | Mihajlovic et al. | |
| 9,959,919 B2 | 5/2018 | Saida et al. | |
| 2005/0018476 A1 | 1/2005 | Kamijima et al. | |
| 2005/0068676 A1 | 3/2005 | Lille et al. | |
| 2006/0132987 A1 | 6/2006 | Shimura et al. | |
| 2007/0023807 A1 | 2/2007 | Haratani et al. | |
| 2007/0081381 A1* | 4/2007 | Lenssen | G11B 5/00 365/158 |
| 2007/0206627 A1 | 9/2007 | Harrison | |
| 2010/0254182 A1* | 10/2010 | Kuroiwa | G11C 11/1675 365/158 |
| 2013/0058156 A1 | 3/2013 | Ohno et al. | |
| 2016/0196951 A1* | 7/2016 | Ohsawa | H01J 37/30 250/492.3 |
| 2016/0225423 A1 | 8/2016 | Naik et al. | |
| 2016/0232958 A1 | 8/2016 | Bandiera | |
| 2016/0232959 A1 | 8/2016 | Lee et al. | |
| 2016/0276008 A1 | 9/2016 | Saida et al. | |
| 2016/0303392 A1 | 10/2016 | Wang et al. | |
| 2017/0077394 A1 | 3/2017 | Saida | |
| 2017/0117027 A1 | 4/2017 | Braganca et al. | |
| 2017/0117323 A1 | 4/2017 | Braganca et al. | |
| 2017/0125078 A1 | 5/2017 | Mihajlovic et al. | |
| 2017/0179372 A1 | 6/2017 | Braganca | |
| 2017/0301727 A1 | 10/2017 | Lai et al. | |
| 2017/0352702 A1 | 12/2017 | Braganca et al. | |
| 2018/0090677 A1 | 3/2018 | Sasaki | |
| 2018/0106873 A1 | 4/2018 | Wu et al. | |
| 2018/0123026 A1 | 5/2018 | Sasaki et al. | |
| 2019/0035449 A1* | 1/2019 | Saida | G11C 11/1675 |

OTHER PUBLICATIONS

U.S. Appl. No. 16/024,521, filed Jun. 29, 2018, Sandisk Technologies LLC.

USPTO Office Communication, Non-Final Office Action for Corresponding U.S. Appl. No. 16/024,521, dated Apr. 19, 2019, 10 pages.

* cited by examiner

SPIN ORBIT TORQUE MAGNETORESISTIVE RANDOM ACCESS MEMORY CONTAINING SHIELDING ELEMENT AND METHOD OF MAKING THEREOF

FIELD

The present disclosure relates generally to the field of magnetic storage elements, and particularly to spin orbit torque (SOT) magnetoresistive memory cells.

BACKGROUND

Magnetoresistive random access memory (MRAM) is a non-volatile random-access memory technology. Unlike conventional random access memory (RAM), data in MRAM devices are not stored as electric charge or current flows. Instead, data is stored by magnetic storage elements. MRAM devices include cells or elements having a magnetically hard layer (i.e., a "reference" layer) and a magnetically soft layer (i.e., the "free" layer). Writing to MRAM is performed by passing current through current leads that are formed on either side of each memory element in order to create a local induced magnetic field, which sets the direction of the soft layer magnetization. Significant problems arise when scaling these devices to high densities. Particularly, the currents required to generate sufficient field to switch the free layer become prohibitively large, and disturbances to neighboring cells or elements can occur during writing, which in turn may cause a neighboring cell to be erroneously written.

Spin transfer torque (STT) MRAM devices are similar to conventional MRAM devices except that the write current paths pass through the magnetic layers of each memory element. The free layer is set via the spin transfer torque from the spin polarized current passing through the reference magnetic layer. Spin orbit torque (SOT) MRAM devices are similar to spin transfer torque (STT) MRAM devices except that the read and write paths are independent. Because the write current does not pass through the thin tunnel barrier layer, SOT MRAM devices can have better endurance. Recent designs for SOT MRAM devices are disclosed, for example, in U.S. Patent Application Publication No. 2017/0125078.

SUMMARY

According to an aspect of the present disclosure, an MRAM assembly comprises a substrate, a plurality of MRAM cells, a plurality of bit lines, each bit line magnetically coupled to one of the plurality of MRAM cells, a plurality of word lines, each word line magnetically coupled to one of the plurality of MRAM cells, a first planar ferromagnetic shielding component located vertically above the substrate such that the plurality of bit lines and the plurality of word lines are located between the first planar ferromagnetic shielding component and the substrate, and a first insulating layer located between the first ferromagnetic shielding component and one of the bit lines or word lines such that the bit lines or word lines are not electrically connected to the first ferromagnetic shielding component.

A surface of the first ferromagnetic shielding component is co-planar with a surface of the substrate to within ±5°. The MRAM assembly may comprise a second ferromagnetic shielding component located between the substrate and the plurality of bit lines and word lines, and a second insulating layer located between the second ferromagnetic shielding component and the other one of the bit lines or word lines such that the bit lines or word lines are not electrically connected to the second ferromagnetic shielding component. The assembly may be located on a substrate and a surface of the first ferromagnetic shielding component may be co-planar with a surface of the substrate to within ±5°. A surface of the second ferromagnetic shielding component may be co-planar with a surface of the substrate to within ±5°. The first and second ferromagnetic shielding components may comprise a sheet of the same soft ferromagnetic material that overlies or underlies the plurality of MRAM cells. The first ferromagnetic shielding component may comprise ferromagnetic material that retains at least 50% of its room temperature magnetization after exposure to 400° C. for more than one minute. The first ferromagnetic shielding component may comprise an alloy of iron with at least one of Ni, Si, Al, Co, and Mn. The first ferromagnetic shielding component may comprise at least one of a nickel iron alloy (e.g. permalloy) and sendust, and combinations thereof. The first insulating layer may be located between and contacts the first ferromagnetic shielding component and the bit lines, and electrically isolate the first ferromagnetic shielding component from the plurality of bit lines. The second insulating layer may be located between and contacts the second ferromagnetic shielding component and word lines, and electrically isolate the second ferromagnetic shielding component from the plurality of word lines. The first and second insulating layers may each comprise the same insulating material. The insulating material may be one of $Al_2O_3$, $SiO_2$, and SiN, or a combination thereof. The plurality of MRAM cells may comprise at least one Spin Orbit Torque (SOT) MRAM device. Alternatively, the plurality of MRAM cells may comprise at least one Spin Transfer Torque (STT) MRAM device.

Aspects of this disclosure further include a method of operating an MRAM assembly, comprising storing data in the MRAM cells, and exposing the assembly to magnetic fields external to the assembly, wherein data storage in the MRAM cells is substantially unaffected by a presence of the magnetic fields external to the assembly (e.g., less than 0.1% of the MRAM cells in the assembly are corrupted by these magnetic fields).

Aspects of this disclosure further include a Spin Orbit Torque (SOT) Magnetoresistive Random Access Memory (MRAM) device, comprising a word line, a bit line, a SOT MRAM cell located between and coupled to the word line and the bit line, a first ferromagnetic shielding layer, and a first insulating layer located between the first ferromagnetic shielding layer and one of the bit line or word line such that the bit line or word line is not electrically connected to the first ferromagnetic shielding layer. In one embodiment, the SOT MRAM device further comprises a second ferromagnetic shielding layer, and a second insulating layer located between the second ferromagnetic shielding layer and another one of the bit line or word line such that the other one of the bit line or word line is not electrically connected to the first or the second ferromagnetic shielding layers.

Aspects of this disclosure further include a method of making a Magnetoresistive Random Access Memory (MRAM) assembly, comprising forming a first ferromagnetic shielding component over a substrate such that a surface of the ferromagnetic shielding component is co-planar with a surface of the substrate to within ±5°, depositing a first insulating layer over the ferromagnetic shielding component, depositing a first conductive layer over the first insulating layer, patterning the first conductive layer to form a plurality of word lines, forming a plurality of MRAM cells over the plurality of word lines, depositing a second insulating layer over the plurality of MRAM cells and the plurality of word lines, depositing a second conductive layer over the second insulating layer, patterning the second conductive layer to form a plurality of bit lines, and depositing a third insulating layer over the plurality of bit lines. In one embodiment, the method further comprises forming a second ferromagnetic shielding component over the third insulating layer.

In an alternative embodiment of the present disclosure, a method of making a Magnetoresistive Random Access Memory (MRAM) assembly, comprises depositing a first conductive layer over a substrate, patterning the first conductive layer to form a plurality of word lines, forming a plurality of MRAM cells over the plurality of word lines, depositing a first insulating layer over the plurality of MRAM cells and the plurality of word lines, depositing a second conductive layer onto the first insulating layer, patterning the second conductive layer to form a plurality of bit lines, depositing a second insulating layer over the plurality of bit lines, depositing a first ferromagnetic shielding component over the second insulating layer such that a surface of the ferromagnetic shielding component is coplanar with a surface of the substrate to within ±5°, and depositing a third insulating layer onto the first ferromagnetic shielding component. In one embodiment, the method further comprises forming a second ferromagnetic shielding component and a fourth insulating layer over the substrate prior to forming the first conductive layer.

In one embodiment of the above methods, the plurality of MRAM cells comprise Spin Orbit Torque (SOT) MRAM cells, forming the first ferromagnetic shielding component comprises forming the first ferromagnetic shielding component by lift-off or electroplating; and the third insulating layer is planarized by chemical mechanical polishing after being deposited.

DETAILED DESCRIPTION

As discussed above, embodiments of the present disclosure is directed to MRAM devices, and has applicability to MRAM devices employing spin orbit torque (SOT) magnetoresistive memory cells, and methods of manufacturing the same, the various aspects of which are described below. The embodiments of the disclosure can be employed to form various semiconductor devices such as three-dimensional memory array devices comprising MRAM devices. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

Figure 1:
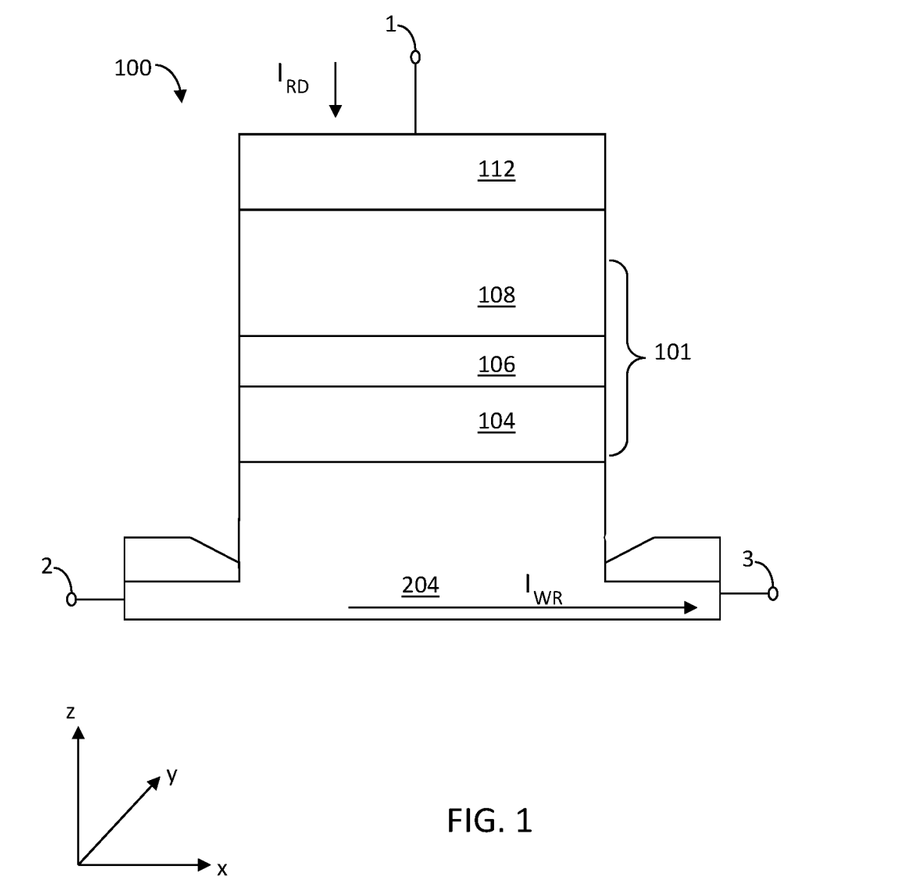
FIG. 1 illustrates a first exemplary structure including an MRAM device according to an embodiment of the present disclosure.

Referring to FIG. 1, embodiments of a first exemplary spin orbit torque (SOT) magnetoresistive memory cell 100 according to an embodiment of the present disclosure are illustrated. The first exemplary SOT magnetoresistive memory cell 100 includes a layer stack, from bottom to top, a nonmagnetic spin Hall effect layer (also known as a SOT layer) 204, a free layer 104, a tunnel barrier layer 106 (e.g., a MgO layer), a reference layer 108, and a cap layer 112. One should also note that the reference layer 108 may comprise of more than one coupled magnetic layers where the net magnetization remains in a fixed direction. The SOT magnetoresistive memory cell is a three-terminal device including a first terminal 1 electrically connected to the hard magnetic layer 112, a second terminal 2 electrically connected to one end of the SOT layer 204, and a third terminal 3 electrically connected to another end of the SOT layer 204.

The free layer 104 (e.g., a CoFeB and/or CoFe layer) has primarily two bi-stable magnetization directions. The free layer 104 may a vertical easy axis of magnetization due to perpendicular magnetic anisotropy of sufficient strength, or may have a horizontal easy axis of magnetization due to in-plane magnetic anisotropy of sufficient strength. The magnetization of the free layer 104 is nominally kept along an easy axis of magnetization (such as the z-axis or the x-axis), but its direction can be switched between two states: parallel or antiparallel to the reference layer 108, in response to the spin orbit torque (SOT) generated by passing a write current IWR through the nonmagnetic spin Hall effect layer or SOT layer 204. The spin Hall effect is a transport phenomenon in a nonmagnetic conductor consisting of the generation of spin current flow in a direction perpendicular to the plane defined by electrical current direction and that of the spin polarization direction. In an illustrative case, if the magnetization of the reference layer 108 is in the "up" direction, the magnetization of the free layer 104 points in the upward z-direction in the parallel state, and points in the downward z-direction in the antiparallel state. If the magnetization of the reference layer 108 is in the positive x-axis direction, the magnetization of the free layer 104 points in the positive x-axis direction in the parallel state, and points in the negative x-axis direction in the antiparallel state. The two states of magnetization of the free layer 104 may correspond to logical states of 0 and 1. The layer stack of the reference layer 108, the tunnel barrier layer 106, and the free layer 104 constitutes a magnetic tunnel junction 101. Various additional non-magnetic layers, such as tantalum, tungsten and/or ruthenium may be formed as part of the magnetic tunnel junction.

The nonmagnetic spin Hall effect layer 204 is positioned beneath the free layer 104, and may be in contact with the free layer 104. According to an embodiment of the present disclosure, the spin Hall effect layer 204 includes a material that is non-magnetic and exhibits a spin Hall effect, such as Pt, PtAu alloy, other Pt alloys, Ta, W, layer stack including multiple beta phase tungsten layers, or combinations thereof such that a significant volume fraction (such as more than 50%, more than 80%, and/or more than 90%) of beta phase tungsten is provided for electrical conduction of the write current IWR, as disclosed in U.S. patent application Ser. No. 15/701,761, herein incorporated by reference in its entirety.

During sensing (i.e., reading) operation, a read current IRD may flow between terminal 1 and terminal 3 through the tunnel junction 101. During a programming (i.e., writing) operation, a write current IWR may flow between terminal 2 and terminal 3. A fraction of the spin current can flow up and into (and down and out of) the nonmagnetic SOT layer 204 when passing underneath to induce the transition of the magnetization of the free layer 104. The write current does not flow through the tunnel junction 101 to terminal 1. Thus, the read and write currents flow in different directions.

Figure 2:
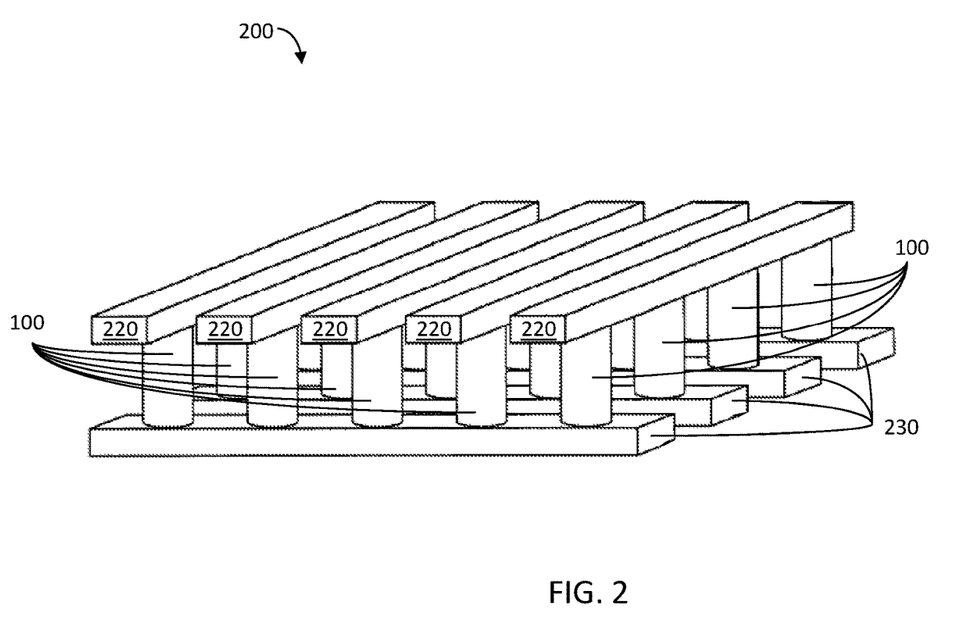
FIG. 2 illustrates an MRAM array according to an embodiment.

FIG. 2 shows an exemplary SOT assembly 200 in accordance with certain embodiments. As shown in FIG. 2, individual SOT cells ("SOT" or "SOTs" hereinafter) 100 are configured in an array that is bounded on the top and bottom by data lines. FIG. 2 shows bit lines 220 on the top of the assembly 200 and word lines 230 on the bottom. However, is to be understood that this configuration can be reversed and/or other suitable configurations could be used within the various embodiments. For example word lines 230 could be placed instead on the top of the assembly. Alternatively, word lines 230 and bit lines 220 could alternate or have a number of other suitable arrangements in the context of the present disclosure.

Herein, the terms "bit lines 220" and "word lines 230" are used in a similar sense as for other chip technology (e.g., in Dynamic Random Access Memory (DRAM) Resistive RAM (ReRAM) or NAND (e.g., flash) memory technology). For example, the rows in the array are generally called word lines 230 while the columns are called bit lines 220. The word lines 230 can generally be represented by gate connect lines (not shown) which can be metallic, polysilicon, or a combination of other suitable materials. The gate connect lines (not shown) connect gates of transistors in a certain row in the array segment. In this configuration, activating/deactivating a word line (increasing/decreasing the voltage on the word line) closes transistors connected to the word line. Bit lines 220, in contrast, may comprise metallic or polysilicon stripes perpendicular to the word lines and can physically connect to the source or drains of the cell transistors. In this way, bit lines may provide the lines through which information is read or written to each of the SOTs 100 in assembly 200. Addressing individual bits may require additional circuitry or incorporating an in-stack selector (a highly non-linear electrical switch) in to the stack 100 or the larger array of devices 200.

Apart from the materials mentioned above, bit lines 220 and word lines 230, more generally, can be made from any suitable conductive material, for example polysilicon, tungsten, titanium nitride, copper, aluminum, or combinations thereof. Bit lines 220 and word lines 230 need not be made from the same material, although there may be certain processing and assembly advantages in making bit lines 220 and word lines 230 from the same material.

The SOT's 100 in the assembly 200 may be the same as SOT 100 shown in FIG. 1. However, is also to be understood that assembly 200 is general and can incorporate different types of SOT's 100 than shown in FIG. 1. In general, any suitable SOT 100 can be used in the assembly 200. Moreover, certain SOT's 100 can be replaced by other elements, for example STT's (not shown). In fact, assembly 200 may include both SOT's and STT's in various locations denoted by 100.

Figure 3:
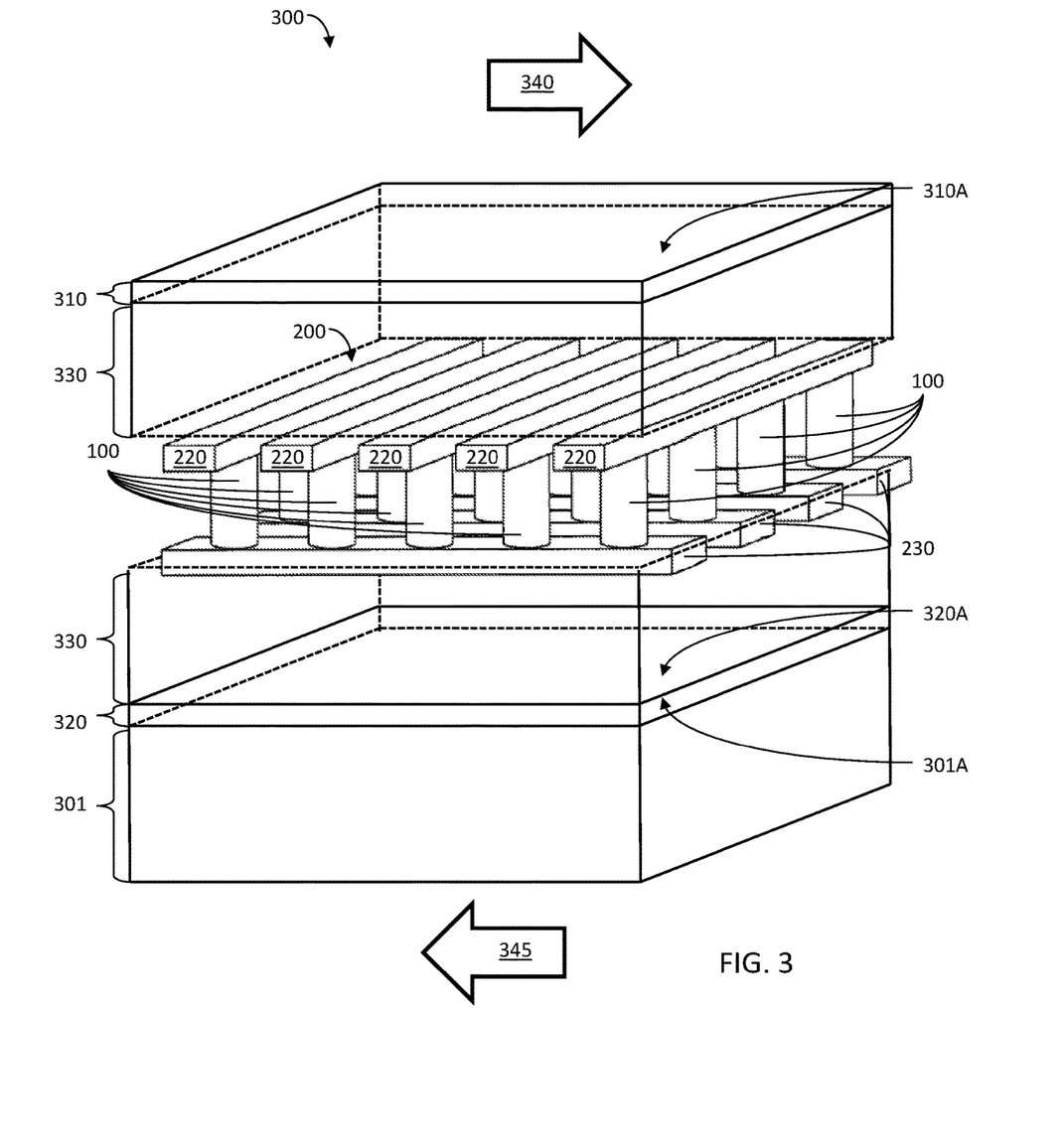
FIG. 3 illustrates a shielding configuration for the MRAM array of FIG. 2 according to an embodiment.

FIG. 3 shows an assembly 300 that incorporates assembly 200 of FIG. 2 along with two shielding components 310 and 320, according to an exemplary embodiment. FIG. 3 depicts the entire assembly 300 located on a substrate 301. As discussed in more detail below, assembly 300 may be fabricated by depositing or patterning its various components on the substrate 301. For example, FIG. 3 shows shielding component 320 directly deposited on substrate 301. In this configuration, the lower surface 320A of shielding component 320 is substantially co-planar with a top (i.e., major) surface 301A of substrate 301. Alternatively, an insulating layer may be located between the substrate 301 and shielding component 320.

As shown in FIG. 3, shielding component 310 is placed above bit lines 220 and shielding component 320 is placed below word lines 230. FIG. 3 shows the lower surface 310A of shielding component 310 as being co-planar with surface 301A of substrate 301. However, it is to be understood that shielding component 310 may have other suitable configurations.

External magnetic fields or "external fields" may be generated outside of assembly 300, either by wiring or magnets in devices containing the assembly 300 or from outside such a device (e.g., power lines, magnetic resonance imaging (MRI) systems, etc.). These external fields are represented schematically in FIG. 3 as fields 340 and 345 shown schematically in FIG. 3. External fields may cause inadvertent switching in SOT 100. Such switching or "bit flipping" can also lead to less catastrophic corruption of stored data, e.g., individual bit corruption that is difficult to detect and correct. Sources of external magnetic fields 340 and 345 are numerous. For example, external magnetic field sources include current-carrying wiring in virtually any electrical component (e.g., computing or memory devices, power supplies, fans, motors, etc.) in which the assembly 300 is located or placed adjacent to. Any system that produces relatively large currents, and/or includes large permanent magnets may produce external fields large enough to affect memory storage in array 200. Examples thereof include pacemakers, MRI systems, power lines, magnetic read/write heads, speakers or other similar devices.

Incorporating suitable ferromagnetic shielding components 310 and 320 into the assembly 200 may shield or protect SOTs 100 in assembly 200 from external fields 340 and 345. More specifically, shielding components 310 and 320 redirect fields 340 and 345 away from SOTs 100 in assembly 200. The process is discussed in more detail with respect to FIG. 4 below. Redirecting external fields can decrease the sensitivity of memory assembly 200 to external fields, improving the accuracy and durability of assembly 200.

As shown in FIG. 3, insulating material 330 may be located in between shielding component 310 and bit lines 220 such that shielding component 310 is not electrically connected to bit lines 220. FIG. 3 also shows an insulating material 330 between shielding component 320 and word lines 230 such that shielding component 320 is not electrically connected to word lines 230. Among other things, the insulating material 330 prevents electrical contact or communication between shielding components 310 and 320 and the bit lines 220 or word lines 230. Since each of these components may be made of conductive material, current can flow between them, for example, to release static buildup. Current flow can cause problems such as short circuiting and/or create of local magnetic fields leading to memory erasure, degrading performance of the bit lines 220, word lines 230, or SOTs 100. Therefore, preventing contact between these components by separating them with insulating material 330 can improve the functioning of assembly 200 and preserve stored memory.

FIG. 3 shows insulating material 330 touching the top of bit lines 220 or bottom of word lines 230. However it is to be understood that this configuration is merely exemplary and that other configurations are included in various embodiments. For example, bit lines 220 may be either completely or partially embedded in insulating material 330 with openings in insulating material 330 permitting contact between word lines 230 and SOTs 100. Insulating material 330 may also fully encompass or enclose word lines 230, partially enclose word lines 230 and/or the entire assembly 200.

Insulating material 330 may comprise any suitable dielectric material with electrical conductivity sufficiently low to decrease electrical communication between bit lines 220, word lines 230, and shielding components 310 and 320. Exemplary materials include commercially available polymers, resins, $Al_2O_3$, $SiO_2$, or silicon nitride, or a suitable combination thereof. Other suitable insulating material 330 includes various plastics, glasses, rubbers, etc. Insulating material 330 may be deposited via chemical vapor deposition (CVD), physical vapor deposition (PVD), spin coating, or other suitable technique.

Shielding components 310 and 320 may comprise any material suitable for magnetic shielding. Examples include various soft ferromagnetic materials that are relatively easy to magnetize and de-magnetize. These include, for example, various nickel iron alloys (e.g., permalloy or alloys of $Ni_xFe_y$, where x and y can take on any suitable value). Still other examples of materials that may be included in shielding components 310 and 320 include "sendust" alloys comprising 85% Fe, 9% Si, and 6% Al., or other commercial magnetic alloys, including alloys of iron with elements such as Si, Co, Mn, and/or Al, as well as various combinations of Ni, Fe, Co, and/or Mn.

Materials that maintain relatively high magnetization at high temperatures may be particularly advantageous for use in shielding components 310 and 320. This is because various processing and preparation steps in fabricating assembly 300, including solder bonding of external components, may require elevated temperatures of 400° C. or more. Therefore, ferromagnetic materials that retain 50% or more of their room temperature magnetization (e.g., their magnetization at 25° C.) when subjected to elevated temperature of 400° C. for more than one minute can be particularly advantageous. Generally, ferromagnetic materials exhibiting limited grain growth at temperatures around and above 400° C. are advantageous, since grain growth tends to degrade magnetization. The final result is to have a magnetic material that (after processing with known high temperature spikes) has more than half of the magnetization as compared to a room-temperature, as-deposited magnetic layer. Nevertheless, any suitable soft magnetic material, including those not mentioned specifically herein, that is suitable for shielding applications may be used in shielding components 310 and 320.

U.S. Pat. No. 9,959,919, herein incorporated by reference, discusses additional ferromagnetic materials that may be incorporated into shielding components 310 and 320. Examples include metallic materials with one element from the following group: Fe, Co, Ni, Mn, and Cr. Rare-earth-transition metal amorphous alloys, such as TbFeCo or GdFeCo may also be used. Such alloys employed in shielding components 310 and 320 may also include at least one element selected from the group Pt, Pd, Ir, Ru, Rh, Ga, and Ge. In addition to the above, shielding components 310 and 320 may include layered or laminate structures of any of these materials, such as laminate layers of Co/Pt, Co/Pd, Co/Ni, Co/Ru, Fe/Au, or Ni/Cu. Any alloy mentioned herein may further contain additives such as Al, Ge, N, P, As, B, or Si, among others.

One advantage in using shielding components 310 and 320 in the configuration shown in FIG. 3 over a prior art design of U.S. Patent Application Publication No. 2018/0123026A1 in which separate shielding layers are disposed directly on each bit line, is that the shielding components 310 and/or 320 may be added as monolithic shielding sheets that overlie or underlie a plurality of MRAM cells (e.g., SOTs 100) above or below bit lines 220 or word lines 230. Such single-layer deposition simplifies fabrication of assembly 300. It also allows the use of etching or deposition techniques to create bit lines 220 and word lines 230 that decrease contamination and improve precision. Specifically, bit lines 220 or word lines 230 (typically comprised of tungsten or polysilicon) can be etched using very precise techniques, such as reactive ion etch (RIE). RIE maintains a high degree of integrity and precision in the dimensions of the bit lines 220 and word lines 230.

In contrast, the prior art design requires each individual bit line to have its own, separate shield layer. In that case, excess shield material deposited between the lines must be removed to prevent shorting between lines. Removal is typically accomplished by a relatively imprecise process such as ion milling. Ion milling, in particular, tends to contaminate etched bit lines. It can also create shorts between the bit lines by leaving shield residue between the bit lines. This can degrade performance and compromise the magnetic integrity of the entire prior art assembly.

Including the direct shielding of shielding components 310 and 320 on-chip as part of the assembly 300 shown in FIG. 3 has additional advantages over other conventional shielding methods. One such conventional method, for example, is to provide shielding in external packaging. Such packaging can be cumbersome and expensive. In contrast, the close proximity of shielding components 310 and 320 to assembly 200 provide more effective shielding, particularly of local stray fields generated by wiring inside the device packaging.

Figure 4:
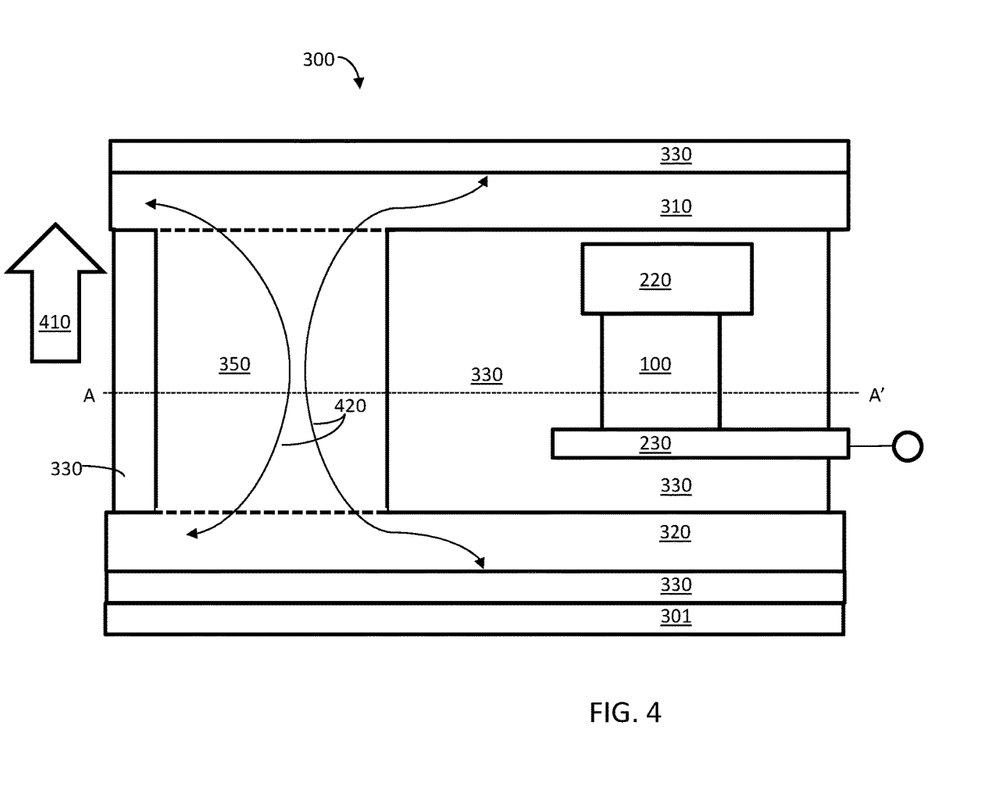
FIG. 4 shows a side view of an assembly according to an embodiment.

FIG. 4 shows a side view of the assembly 300 including a yoke 350 that physically and electrically links shielding components 310 and 320. In particular, FIG. 4 shows how shielding components 310 and 320 may act in tandem with yoke 350 to redirect or shunt external magnetic field 410 around SOT 100. Internal field lines 420 show the external field being redirected around insulating material 330 in which SOTs 100, bit lines 220 and word lines 230 are all embedded. Directing field lines 420 around SOT 100 prevents the field from interfering with memory storage in SOT 100. Is to be understood that FIG. 4 is meant to illustrate the general concept of shunting fields around SOTs 100. Other geometries in specific configurations may also be employed to channel external fields 410 in ways that avoid or diminish inadvertent switching of the state of SOT's 100.

The configuration shown in FIG. 4 provides a magnetic shield design (shielding components 310, 320 and yoke 350 which physically and electrically connects shielding components 310 and 320 to each other) that can protect SOT's 100 from external fields in many different directions, not just the direction of field 410 shown in FIG. 4. It may also shunt stray fields that emanate locally (i.e., in closer proximity to SOTs 100 than field 410 such as field from adjacent SOTs 100). In one embodiment shown in FIG. 4, the yoke 350 is located over the substrate 301 and laterally spaced from the SOT MRAM cell 100 such that a horizontal plane A-A' parallel to a top surface of the substrate 301 intersects both the ferromagnetic yoke and the SOT MRAM cell.

The shield design shown in FIGS. 3 and 4 can be implemented in many different SOT 100 array configurations, other than those shown in FIGS. 3 and 4. In fact, the design fits with any suitable SOT 100 arrangement.

Note that FIG. 4 shows only one monolithic insulator 330 in which the SOT's 100 are embedded. This is different from the configuration in FIG. 3 in which two different insulating layers are shown. Is to be understood that SOT's 100 can be embedded insulator 330 as shown in FIG. 4 or can exist as two or more separate insulating layers as shown in FIG. 3. Although FIG. 4 shows only one SOT 100, is to be understood that is meant to represent an entire SOT array assembly 200 as shown in FIG. 3.

Figure 5A:
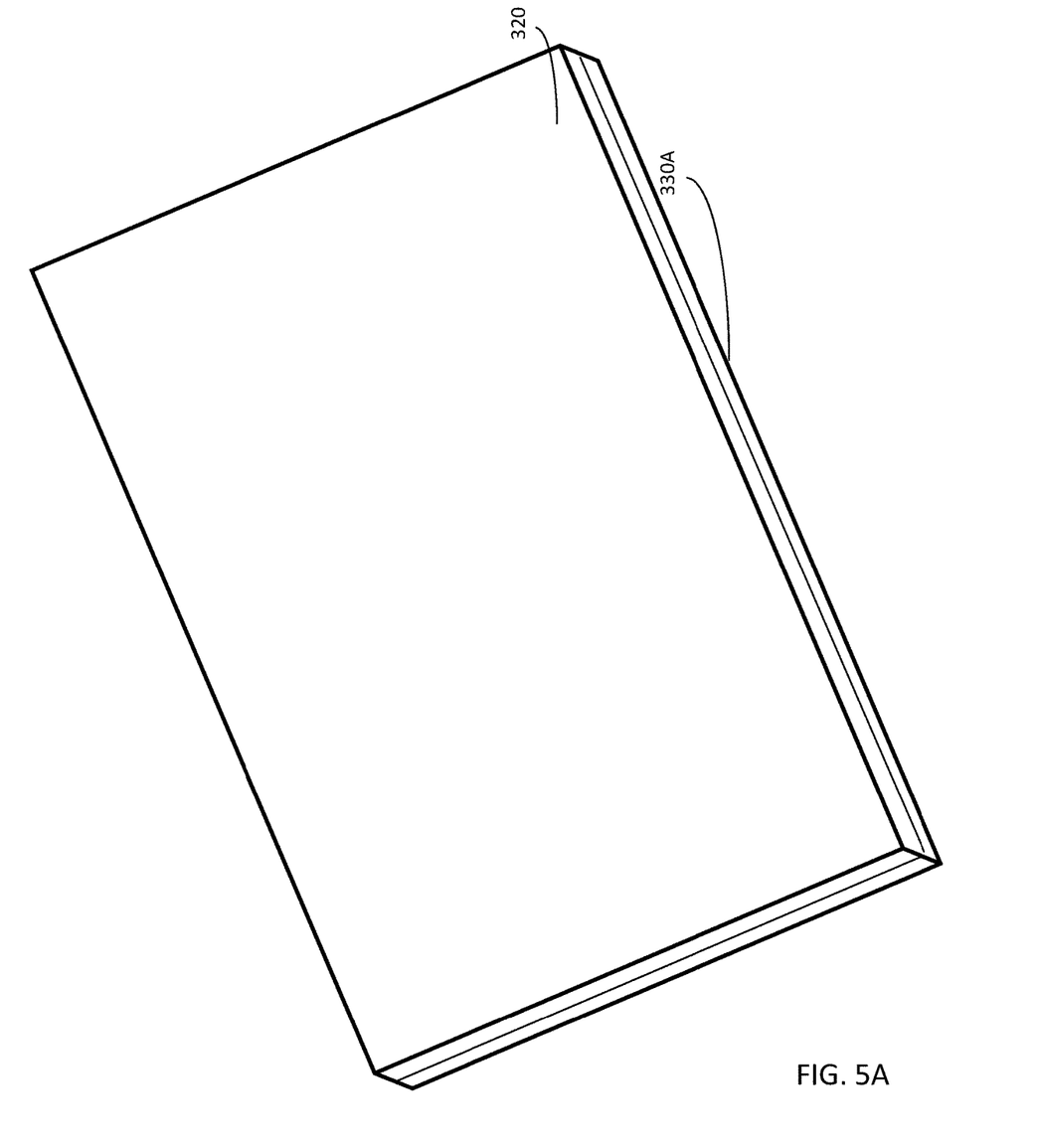
FIGS. 5A-5D show steps in the manufacture of an assembly according to an embodiment.

FIGS. 5A-5D show steps of making a SOT 100 array 500 including the yoke 350. In FIG. 5A, a shielding layer 320 is coated either on an insulating layer 330A, or directly on an underlying substrate 301 (not shown). Methods for coating shielding layer 320 include liftoff (e.g., forming shielding component 320 over the insulating layer 330A by first forming a resist pattern over the insulating layer 330A, depositing shielding component 320 over the resist pattern and over the exposed part of the insulating layer 330A, and then lifting off the resist pattern covered with the part of the shielding component to leave part of the shielding component 320 in a desired location over the insulating layer 330A) or electroplating techniques. Although not shown, other insulating layers 330 may also be present below shielding layer 320, such that shielding layer 320 is sandwiched between layers of insulation (as shown in FIG. 4). Via contacts to underlying devices (e.g., access transistors formed on the substrate 301) can be formed in the insulating layer 330A below shielding component 320.

Figure 5B:
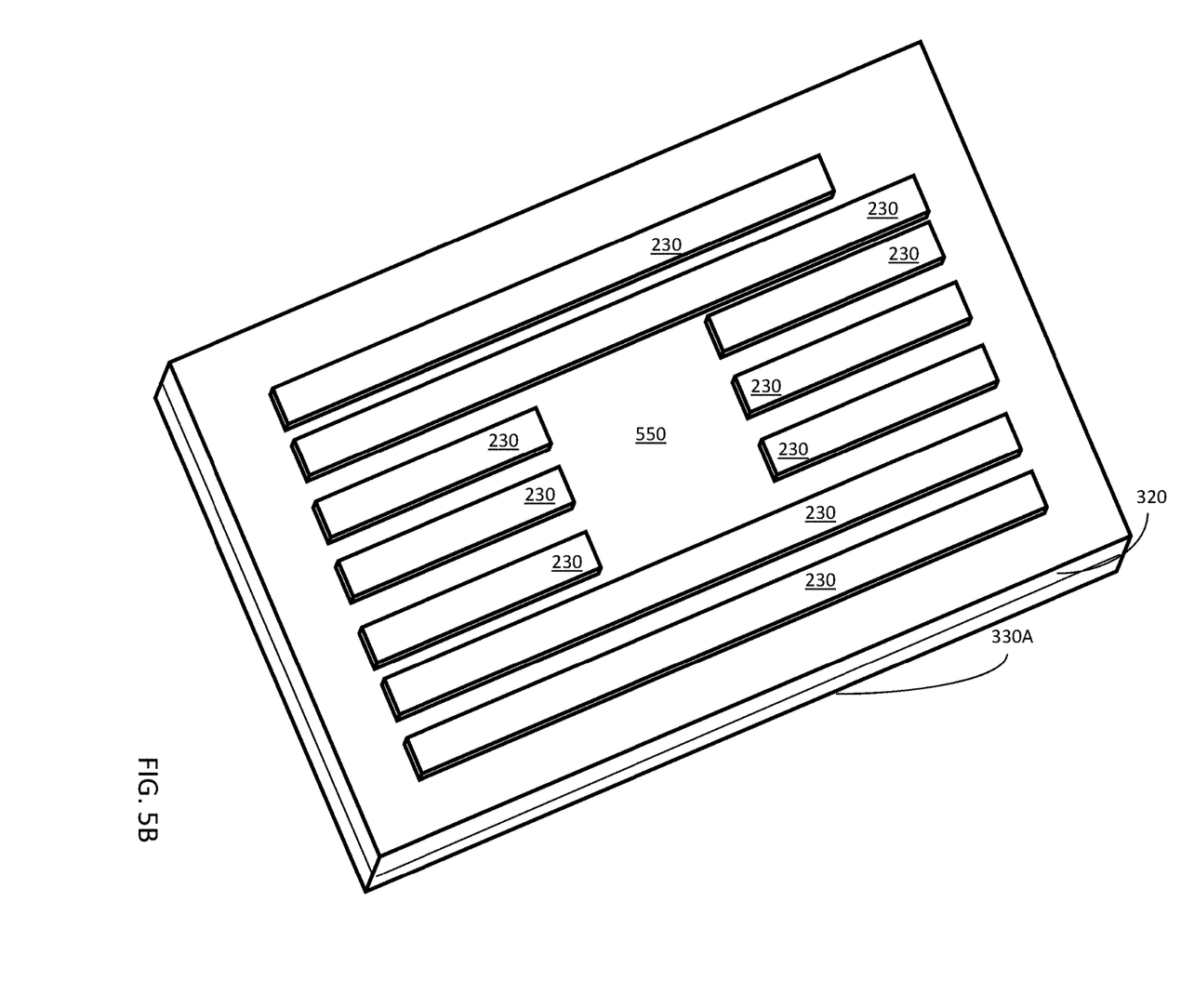

FIG. 5B shows a step of forming word lines 230 on the insulating material 330A. It is to be understood the following discussion applies equally to forming bit lines 220 in place of the word lines 230 in FIG. 5B.

Typical processes for forming word lines 230 include CVD or PVD deposition of monolithic conductive layers on word lines 230, followed by forming a photoresist mask and using RIE to etch specific world line 230 patterns. FIG. 5B shows word lines 230 patterned to leave an open area 550 between them. Open area 550 provides space for a magnetic yoke 350 for connecting shielding layer 320 with other components (e.g., a top shielding layer 310, as shown in FIG. 4). Open area 550 may also provide space for other components, such as control circuit patterns (not shown). If desired, the spin Hall effect layer 204 (and optionally layers 202 and 206 described above) may be formed on all or parts of word lines 230 before formation of the remainder of the SOT 100 layers. Alternatively, word lines 230 can be made of the spin Hall effect layer. Optionally, at this time, spaces between word lines 230 can be filled with the insulating layer 330 followed by planarization.

Figure 5C:
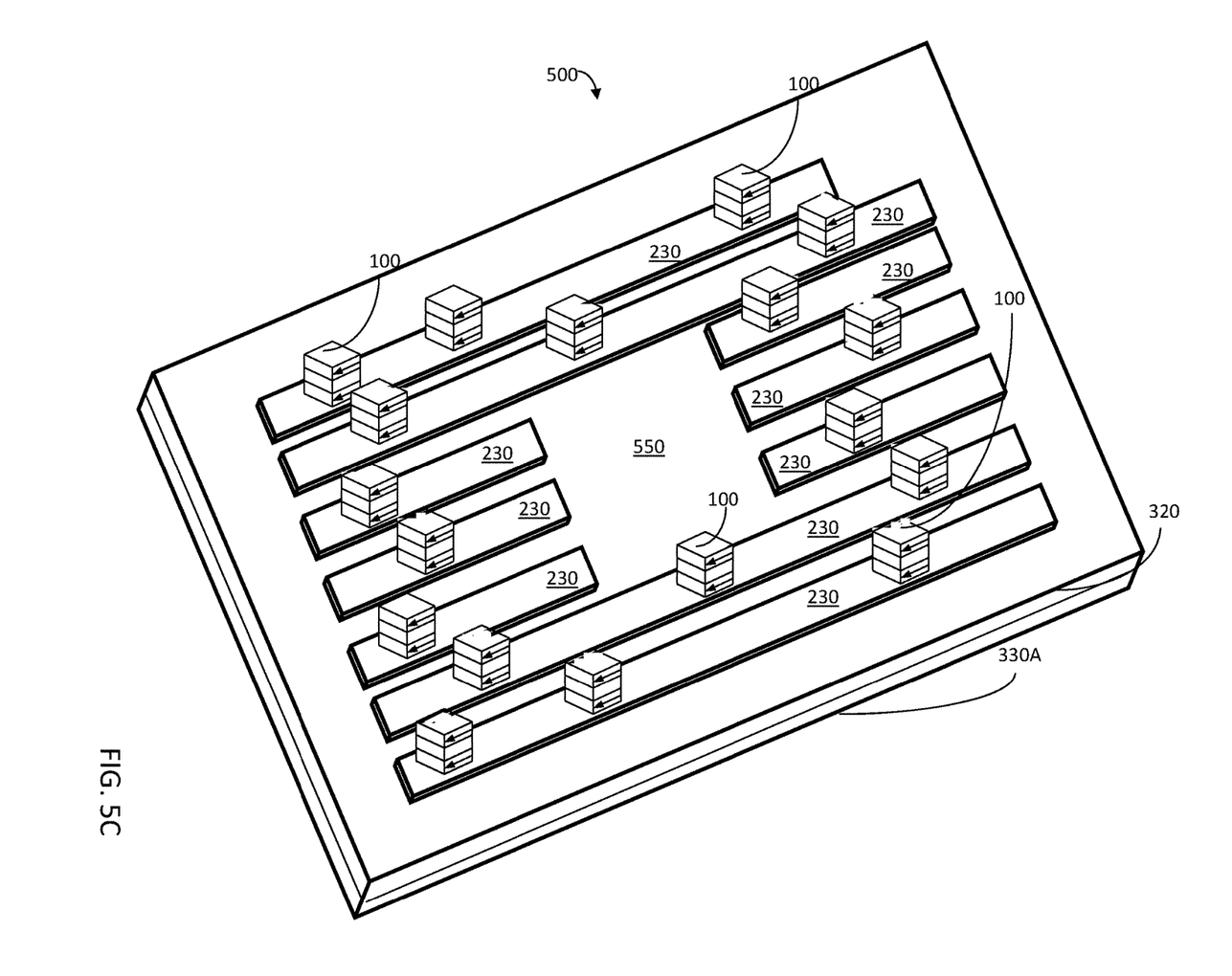

FIG. 5C shows a subsequent step in which individual SOT's 100 are formed over word lines 230. MRAM stacks shown in FIG. 1 for creating individual SOTs 100 are typically sputter deposited. Other suitable deposition techniques may also be utilized.

Figure 5D:
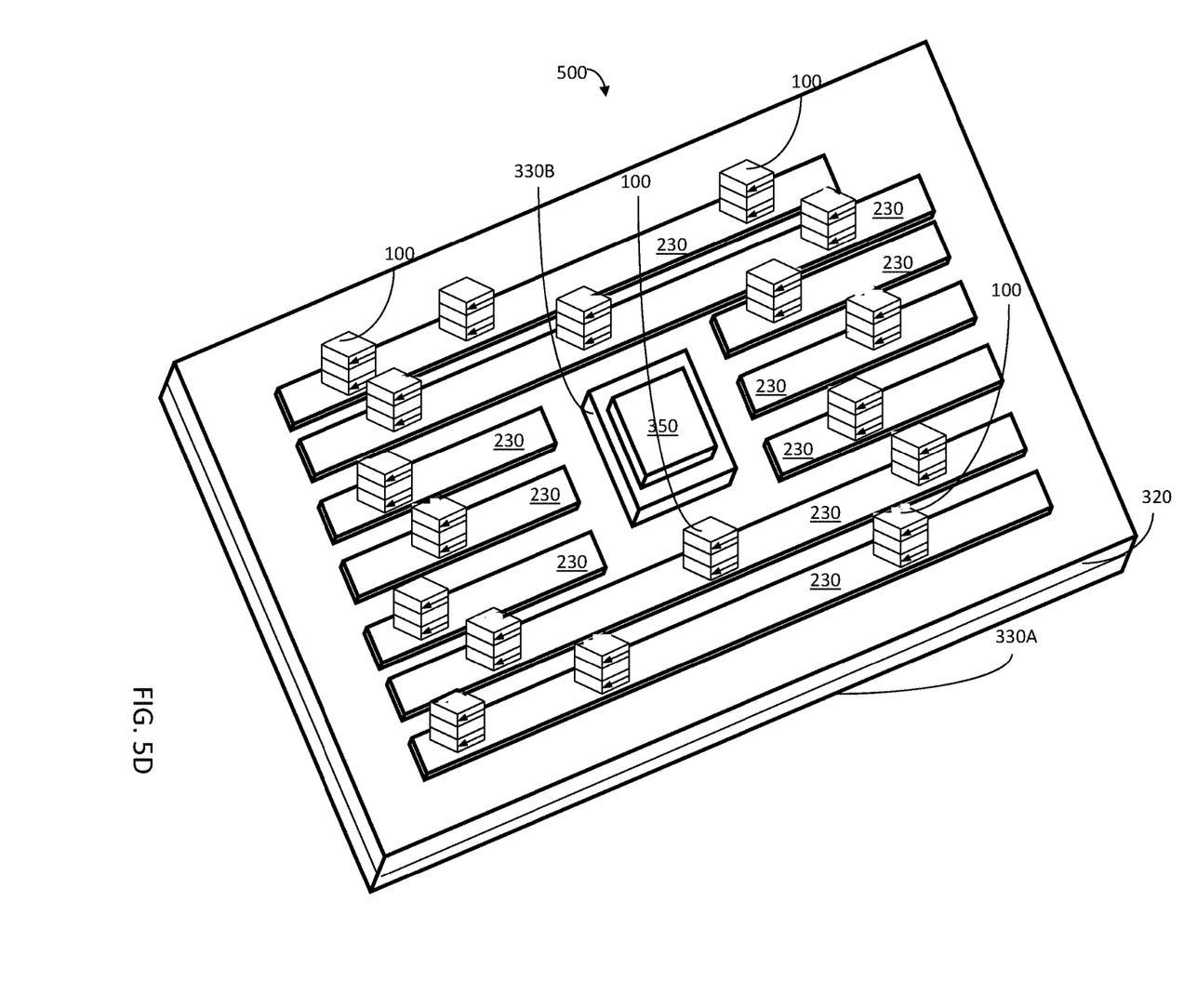

Subsequently to the processing step shown in FIG. 5C, the insulating layer 330 in area 550 is etched down to expose underlying shielding component 320. The etching creates room for fabricating the ferromagnetic yoke 350 to connect the shielding component 320 with other components, such as additional shielding components that may be formed on top of assembly 500 in subsequent steps (e.g., an upper shielding component 310 as shown in FIG. 4). Once area 550 is etched, ferromagnetic material (e.g., any of the materials described above for creating shielding components 310 and 320) is deposited into the hole to form the yoke 350, as shown in FIG. 5D. FIG. 4 shows the profile of the resulting yoke 350 configuration. Magnetic yoke 350 can be coupled to the underlying shielding layer (i.e., shielding component 320) and the overlying shielding layer (i.e., shielding component 310), as shown in FIG. 4.

As shown in FIG. 5D, additional insulating material 330B may be provided in order to isolate sides of the yoke 350 from neighboring components, such as word lines 230. One purpose for adding this insulating material 330B is to prevent electrical communication from yoke 350 to neighboring, conductive components, such as word lines 230. The additional insulating material 330B is shown in profile in FIG. 4.

Once yoke 350 has been formed, additional insulating layers 330 may also be deposited between the SOTs 100 (and optionally between the word lines 230). Subsequently, bit lines 220 are deposited and patterned on top of the SOTs 100 to create the structure shown in profile in FIG. 4. Then, another insulating layer 330 is deposited over the bit lines 230 and the second shielding layer 330 is deposited on top of the insulating layer 330, as shown in FIG. 4. Alternatively, insulating layer 330 may be formed around the yoke 350 and SOTs 100 at the same time. In another alternative embodiment, the yoke 350 may be formed as discussed above before either SOTs 100 or word lines 230 are formed.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A Magnetoresistive Random Access Memory (MRAM) assembly, comprising:
   a substrate;
   a plurality of MRAM cells;
   a plurality of bit lines, each bit line magnetically coupled to one of the plurality of MRAM cells;
   a plurality of word lines, each word line magnetically coupled to one of the plurality of MRAM cells;
   a first planar ferromagnetic shielding component located vertically above the substrate such that the plurality of bit lines and the plurality of word lines are located between the first planar ferromagnetic shielding component and the substrate;
   a first insulating layer located between the first ferromagnetic shielding component and one of the bit lines or word lines such that the bit lines or word lines are not electrically connected to the first ferromagnetic shielding component;
a second ferromagnetic shielding component located between the substrate and the plurality of bit lines and word lines; and
a second insulating layer located between the second ferromagnetic shielding component and the other one of the bit lines or word lines such that the bit lines or word lines are not electrically connected to the second ferromagnetic shielding component.

2. The MRAM assembly of claim 1, wherein a surface of the first ferromagnetic shielding component is co-planar with a surface of the substrate to within ±5°.

3. The MRAM assembly of claim 1, wherein:
the assembly is located on a substrate; and
a surface of the first ferromagnetic shielding component is co-planar with a surface of the substrate to within ±5°; and
a surface of the second ferromagnetic shielding component is co-planar with a surface of the substrate to within ±5°.

4. The MRAM assembly of claim 3, wherein the first and second ferromagnetic shielding components comprise a sheet of the same soft ferromagnetic material that overlies or underlies the plurality of MRAM cells.

5. The MRAM assembly of claim 1, wherein the first ferromagnetic shielding component comprises ferromagnetic material that retains at least 50% of its room temperature magnetization after exposure to 400° C. for more than one minute.

6. The MRAM assembly of claim 1, wherein the first ferromagnetic shielding component comprises an alloy of iron with at least one of Ni, Si, Al, Co, and Mn.

7. The MRAM assembly of claim 1, wherein the first ferromagnetic shielding component comprises at least one of a nickel alloy, iron alloy, sendust, and combinations thereof.

8. The MRAM assembly of claim 1, wherein:
the first insulating layer is located between and contacts the first ferromagnetic shielding component and the bit lines, and electrically isolates the first ferromagnetic shielding component from the plurality of bit lines; and
the second insulating layer is located between and contacts the second ferromagnetic shielding component and word lines, and electrically isolates the second ferromagnetic shielding component from the plurality of word lines.

9. The MRAM assembly of claim 1, wherein the first and second insulating layers each comprise the same insulating material selected from $Al_2O_3$, $SiO_2$, and SiN, or a combination thereof.

10. The MRAM assembly of claim 1, wherein the plurality of MRAM cells comprises at least one Spin Orbit Torque (SOT) MRAM device.

11. A method of operating the MRAM assembly of claim 1, comprising storing data in the MRAM cells, and exposing the assembly to magnetic fields external to the assembly, wherein data storage in the MRAM cells is substantially unaffected by a presence of the magnetic fields external to the assembly.

12. A Spin Orbit Torque (SOT) Magnetoresistive Random Access Memory (MRAM) device, comprising:
a word line;
a bit line;
a SOT MRAM cell located between and coupled to the word line and the bit line;
a first ferromagnetic shielding layer;
a first insulating layer located between the first ferromagnetic shielding layer and one of the bit line or word line such that the bit line or word line is not electrically connected to the first ferromagnetic shielding layer;
a second ferromagnetic shielding layer; and
a second insulating layer located between the second ferromagnetic shielding layer and another one of the bit line or word line such that the other one of the bit line or word line is not electrically connected to the first or the second ferromagnetic shielding layers.

13. A method of making a Magnetoresistive Random Access Memory (MRAM) assembly, comprising:
forming a first ferromagnetic shielding component over a substrate such that a surface of the ferromagnetic shielding component is co-planar with a surface of the substrate to within ±5°;
depositing a first insulating layer over the ferromagnetic shielding component;
depositing a first conductive layer over the first insulating layer;
patterning the first conductive layer to form a plurality of word lines;
forming a plurality of MRAM cells over the plurality of word lines;
depositing a second insulating layer over the plurality of MRAM cells and the plurality of word lines;
depositing a second conductive layer over the second insulating layer;
patterning the second conductive layer to form a plurality of bit lines;
depositing a third insulating layer over the plurality of bit lines; and
forming a second ferromagnetic shielding component over the third insulating layer.

14. The method of claim 13, wherein:
the plurality of MRAM cells comprise Spin Orbit Torque (SOT) MRAM cells;
forming the first ferromagnetic shielding component comprises forming the first ferromagnetic shielding component by lift-off or electroplating; and
the first insulating layer is planarized by chemical mechanical polishing after being deposited.

15. A method of making a Magnetoresistive Random Access Memory (MRAM) assembly, comprising:
depositing a first conductive layer over a substrate;
patterning the first conductive layer to form a plurality of word lines;
forming a plurality of MRAM cells over the plurality of word lines;
depositing a first insulating layer over the plurality of MRAM cells and the plurality of word lines;
depositing a second conductive layer onto the first insulating layer;
patterning the second conductive layer to form a plurality of bit lines;
depositing a second insulating layer over the plurality of bit lines;
depositing a first ferromagnetic shielding component over the second insulating layer such that a surface of the ferromagnetic shielding component is co-planar with a surface of the substrate to within ±5°;
depositing a third insulating layer onto the first ferromagnetic shielding component; and
forming a second ferromagnetic shielding component and a fourth insulating layer over the substrate prior to forming the first conductive layer.

16. The method of claim 15, wherein:
the plurality of MRAM cells comprise Spin Orbit Torque (SOT) MRAM cells;
forming the first ferromagnetic shielding component comprises forming the first ferromagnetic shielding component by lift-off or electroplating; and
the third insulating layer is planarized by chemical mechanical polishing after being deposited.

* * * * *